United States Patent [19]

Tanimoto et al.

[11] 4,019,669

[45] Apr. 26, 1977

[54] WIRE BONDING APPARATUS

[75] Inventors: Michio Tanimoto, Hachioji; Yuzo Taniguchi, Kunitachi, both of Japan

[73] Assignee: Hitachi, Ltd., Japan

[22] Filed: Sept. 15, 1975

[21] Appl. No.: 613,542

[30] Foreign Application Priority Data

Sept. 13, 1974 Japan ............................ 49-105021

[52] U.S. Cl. .......................... 228/4.5; 242/147 A; 242/156
[51] Int. Cl.[2] ................. H05K 13/06; B65H 59/16
[58] Field of Search ...................... 228/4.5, 904; 242/147 A, 156; 29/157 C

[56] References Cited
UNITED STATES PATENTS 3,643,321   2/1972   Field et al. .................... 228/4.5 X

FOREIGN PATENTS OR APPLICATIONS 1,140,629   4/1957   France ......................... 242/147 A
865,022   4/1961   United Kingdom ............... 242/156

Primary Examiner—Al Lawrence Smith
Assistant Examiner—K. J. Ramsey
Attorney, Agent, or Firm—Craig & Antonelli

[57] ABSTRACT

A wire bonder which includes a spool from which wire is drawn out, a capillary bonding head adapted to hold the wire and to extend the wire downwardly from the spool, and a tensioning mechanism. The tensioning mechanism includes a nozzle for directing a jet of gas against the wire with the nozzle being disposed in opposition to two guide plates disposed along the flow path of the gas ejected from the nozzle. The guide plates are spaced apart from each other to provide a space through which wire is passed from the spool to the capillary bonding head.

10 Claims, 2 Drawing Figures

WIRE BONDING APPARATUS

FIELD OF THE INVENTION

This invention relates to the improvements in wire bonder used in semiconductor manufacturing process.

DESCRIPTION OF THE PRIOR ART

Generally, in wire bonding in a semiconductor manufacturing process, it is required to stretch the wire while preventing "pellet short" problems resulting from touch of wire with pellet, "tab short" caused by touch of wire with the tab supporting the pellet, and "lead short" resulting from touch of wire with lead.

For this purpose, when the wire which has been bonded at its one end to a first bonding spot is stretched from the first bonding spot to a second bonding spot, it is necessary to first draw out the wire by the length of $lo + \alpha$, with $lo$ being the length necessary for stretching from the first to the second bonding spot, and $\alpha$ being an additional extra length, from the capillary bonding head and draw in said extra length ($\alpha$) of wire into the capillary bonding head immediately before the wire reaches the second bonding spot. If the necessary length ($lo$) of wire alone is drawn out from the capillary bonding head and passed to the second bonding spot after completion of bonding at the first bonding spot, the wire extending out from the first bonding spot does not form a sufficiently large curve, that is, it describes only a small curve, so that the wire portion lying between the two bonding spots hangs down to cause various kinds of "short" troubles mentioned above. In the case of nailhead bonding, it is necessary to draw the wire in the capillary bonding head such that the ball at the wire end contacts the bottom surface of the capillary bonding head.

In order to satisfy above demands, a leaf spring has been proposed which is disposed in contact with the wire portion between the spool and the capillary so as to give tension to the wire. This method however is still unsatisfactory in providing sufficient wire tension in a wire bonder. That is, according to this method, vibration is likely to be produced owing to use of a leaf spring, so that this method is undesireable in high-speed operation.

Thus, since the conventional means are unable to provide constant tension to the wire, they are not suited for high-speed wire bonding and it is also difficult to give a desired curved configuration to the wire.

BRIEF SUMMARY OF THE PRESENT INVENTION

The present invention aims at eliminating these defects of the prior art. Hence it is an object of the present invention is to provide a wire bonder equipped with a wire tensioning mechanism whereby resistance of the wire drawn out from a capillary as well as wire retreating force is kept constant independently of the feed speed, and to also provide a high-speed wire bonder.

In order to accomplish such object, the present invention provides a pair of guide plates disposed along the flow of a gaseous body jetted from a nozzle against the wire so as to keep constant the flow rate of the gaseous body. That is, these two guide plates are designed to regulate the flow of gaseous body from both sides thereof.

Now the present invention will be described in detail by way of an embodiment thereof as illustrated in the accompanying drawings.

DETAILED DESCRIPTION OF THE INVENTION

Figure 1:
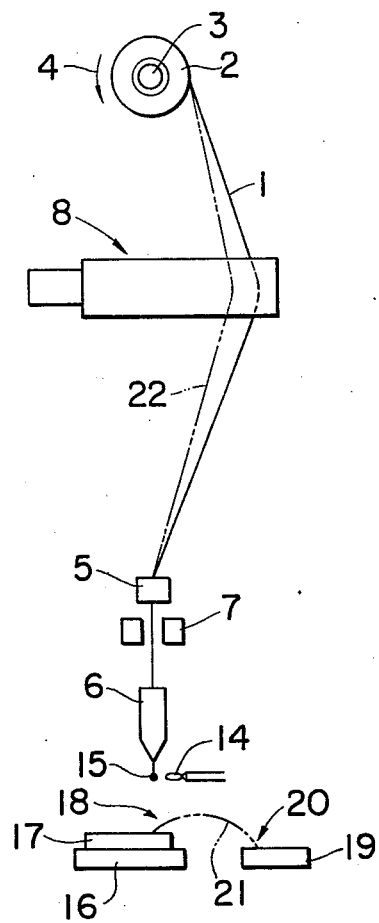
FIG. 1 is a schematic drawing showing the principal components of the wire bonder according to the present invention.

Referring to FIG. 1, there are schematically shown the essential components of the wire bonder according to the present invention. As shown in FIG. 1, a spool 2 carrying a rolled wire 1 thereon is loosely fitted on a shaft 3. An air bearing is interposed between the spool 2 and shaft 3 with an air jet being directed against the contacting inner surface of the spool 2. The jet of air is ejected in a direction at a slant or oblique to the radial direction of the shaft 3 so as to obtain a back tension on the spool 2 thereby always giving the spool 2 a rotative force in the direction of arrow 4. Also the back tension may be realized by blowing a jet of gas against the spool 2.

Figure 2:
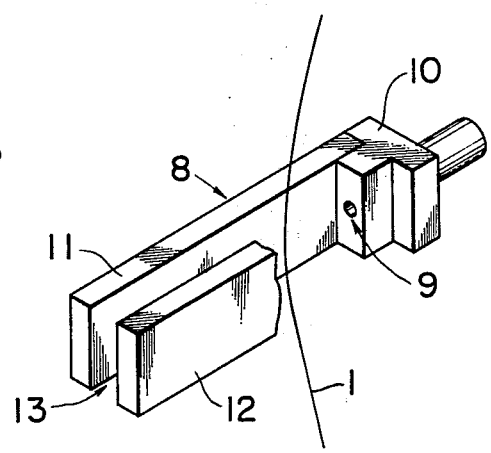
FIG. 2 is a perspective view showing the detail of the wire tensioning mechanism in accordance with the present invention.

The lower end portion of the wire 1 drawn out from the spool 2 passes through a ring-shaped guide 5 and is held by a cylindrical capillary bonding head 6, hereafter referred to as a capillary. Provided between the guide 5 and capillary 6 is a clamper 7 which, when so required, is operated to securely clamp the wire 1. A wire tensioning mechanism generally designated by the reference numeral 8 is provided and disposed in opposition to the wire 1 between the capillary 6 and spool 2. As shown in FIG. 2, the wire tensioning mechanism 8 comprises a nozzle 10 having at its end an aperture 9 from which a gas is ejected with a pair of flat guide plates 11, 12 being mounted at the end of the nozzle 10. The guide plates 11 and 12 are suitably spaced apart from each other to form a space 13 which the gas jet 9 confronts and through which the wire 1 is fed. The guide plates 11, 12 are designed to regulate the flow of the gas jet from both sides thereof.

The operation of the present invention is as follows: the wire 1 is clamped between the clamper 7 and a hydrogen flame 14 is applied to the end of the wire 1 projecting out from the lower end of the capillary 6 to fuse the wire end into a ball-like mass 15. Then the clamper 7 is operated to its open position to release the wire 1 and the wire is pulled back into the capillary until the ball-like mass connects the bottom surface of the capillary. The capillary 6 is lowered down to the electrode portion or the first bonding point 18, of the pellet 17 on the tab 16 to perform bonding. Then the capillary 6 is raised up, then moved horizontally to a point above the lead 19. At this time the wire is drawn out by the length of $lo + \alpha$, as noted hereinabove. The capillary 6 is again lowered to press against the second bonding point 20, the wire is pulled back into the capillary by the length of $\alpha$ by the back tension, then the second bonding is effected. Then both clamper 7 and capillary 6 are raised up and the wire 1 is secured by the clamper 7. The wire is cut at a point close to the second bonding point 20. As a result, a wire loop 21 such as shown by chain line in FIG. 1 is formed and wire bonding is accomplished.

At this time, wire 1 is blown out under pressure of gas ejected from the jet 9, but the lower end of wire is held by the clamper 7 or ball-like mass 15 while the upper end is pulled upwardly by rotational force of the spool 2 in the direction of arrow 4. Consequently, wire 1 forms a curve such as shown in FIG. 1 in a state of equilibrium between the upper end supporting force and gas pressure applied to the wire. It will therefore be understood that when the capillary 6 descends rapidly, wire 1 is once deformed to curve 22 shown by the chain line in FIG. 1 but restores the original shape owing to the above-mentioned principle. Thus, wire 1 is drawn out against rotational force of the spool 2 since gas pressure exerted to wire 1 is increased. Even if this drawing-out action can not follow up sharp descending motion of the capillary 6, no sharp tension develops in the metal wire as such rapid motion is compensated by deformation (curve 22 shown by chain line) of the curved portion of wire 1. Therefore, no break of the curved wire occurs.

Also, since the gas flow is protected at its both sides by the pair of guide plates 11, 12 its flow rate does not fall even if the gas flow moves away from the jet 8. Therefore, constant tension always acts upon the wire 1. Thus, wire 1 is always under constant tension (desired tension), the extra wire portion (with length $\alpha$) extending out from the capillary end, that is, the wire portion drawn out extra in addition to the length $lo$ required for shaping a wire loop, is drawn back into the capillary 6 by the tension at a point just before the second bonding is practiced. Therefore, the wire loop formed will not hang down and a desired tall loop is formed.

As described above, according to the present invention, the wire 1 is passed through the space 13 between a pair of guide plates 11, 12 while receiving the pressure of gas ejected from the jet 9. Since such gas flow is guided uniformly to the terminal ends of the guide plates 11, 12 owing to presence of such plates, constant tension is always given to the wire 1 even if the curve of the wire 1 is changed during the bonding operation. As a result, the bonded wire forms a curve of the most desirable configuration to prevent "short" trouble such as "pellet short", "tab short" or "lead short" of the semiconductor device.

The present invention is not limited to the particular embodiment shown and described hereabove. For instance, pair of guide plates may be arranged parallel to each other or in such a way that the space formed therebetween is narrowed down in the gas flowing direction so as to compensate for decrease of the gas flow rate.

As viewed above, according to the wire bonder of the present invention, wire feed is performed smoothly and no break of wire takes place even if the wire bonding operation is carried out at high speed. Consequently, operating efficiency of the wire bonder is improved. Also, according to the present invention, since constant tension is always given to the wire, wire bonding is practiced always in a preferred form. Therefore, no "short" trouble of wire takes place and the yield is improved.

I claim:

1. A wire bonder comprising: a spool for supplying the wire to be bonded, a shaft means for rotatably mounting said spool, means for holding the wire in a position extended downwardly from said spool, means disposed between said spool and said holding means for tensioning the wire, said means for tensioning including a means for directing a jet of a gas against the wire and means for regulating the flow of the jet of gas, said regulating means including a pair of guide plates, said guide plates being spaced from one another and disposed along the flow of the jet of gas, the wire extending from said spool through the space between said guide plates to said holding means, said holding means including a capillary bonding head, and means for applying a back tension on said spool.

2. A wire bonder according to claim 1, wherein said means for applying a back tension includes a means for directing a jet of gas against said spool.

3. A wire bonder according to claim 1, further comprising air bearing means interposed between said spool and said shaft means whereby air is ejected at a slant to the radial direction of said shaft so as to obtain back tension by utilizing said air jet.

4. A wire bonder according to claim 1, wherein said means for applying a back tension applying a predetermined tension to the wire even when a wire lead is drawn back during a wire bonding operation, and wherein said spool guides the wire therefrom through the space between said guide plates to said capillary bonding head so that the wire describes a predetermined curve between said spool and said capillary bonding head.

5. A wire bonder according to claim 1, wherein a wire clamper is provided between said capillary bonding head and said tensioning mechanism such that desired tension is always kept applied to the wire during the wire bonding work by said wire tensioning mechanism and by said back tension.

6. A wire bonder according to claim 1, wherein said guide plates are disposed in a spaced parallel relationship.

7. A wire bonder according to claim 1, wherein the space between said guide plates decreases in the flow direction of the jet of gas.

8. A wire bonder according to claim 1, wherein said means for directing a jet of gas against the wire includes a nozzle.

9. A wire bonder according to claim 1, wherein a guide means is disposed between said holding means and said capillary bonding head for guiding a lead end of the wire into said capillary bonding head means.

10. A wire bonder according to claim 9, wherein clamping means are provided for clamping the wire during a wire bonding operation, said clamping means being disposed between said guide means and said capillary bonding head.

* * * * *